US010606518B2

(12) United States Patent
Zeng et al.

(10) Patent No.: US 10,606,518 B2
(45) Date of Patent: Mar. 31, 2020

(54) SOLID STATE STORAGE DEVICE AND READ RETRY METHOD THEREOF

(71) Applicant: SOLID STATE STORAGE TECHNOLOGY CORPORATION, Taipei (TW)

(72) Inventors: Shih-Jia Zeng, Taipei (TW); Jen-Chien Fu, Taipei (TW); Tsu-Han Lu, Taipei (TW); Hsiao-Chang Yen, Taipei (TW)

(73) Assignee: SOLID STATE STORAGE TECHNOLOGY CORPORATION, Taipei (TW)

(*) Notice: Subject to any disclaimer, the term of this patent is extended or adjusted under 35 U.S.C. 154(b) by 0 days.

(21) Appl. No.: 16/165,211

(22) Filed: Oct. 19, 2018

(65) Prior Publication Data

US 2020/0042237 A1   Feb. 6, 2020

(30) Foreign Application Priority Data

Aug. 3, 2018   (CN) .......................... 2018 1 0878000

(51) Int. Cl.
*G06F 3/06* (2006.01)
*G11C 16/04* (2006.01)
*G11C 16/08* (2006.01)
*G11C 16/26* (2006.01)

(52) U.S. Cl.
CPC .......... *G06F 3/0659* (2013.01); *G06F 3/0619* (2013.01); *G06F 3/0679* (2013.01); *G11C 16/0408* (2013.01); *G11C 16/08* (2013.01); *G11C 16/26* (2013.01)

(58) Field of Classification Search
CPC .... G06F 3/0659; G06F 3/0619; G06F 3/0679; G11C 16/0408; G11C 16/08; G11C 16/26
USPC .......................................................... 711/103
See application file for complete search history.

(56) References Cited

U.S. PATENT DOCUMENTS

| 9,922,706 B2 | 3/2018 | Zeng et al. | |
| 2010/0199149 A1* | 8/2010 | Weingarten | G06F 11/1068 |
| | | | 714/773 |
| 2018/0211713 A1* | 7/2018 | Zeng | G11C 11/5642 |

* cited by examiner

*Primary Examiner* — Hiep T Nguyen
(74) *Attorney, Agent, or Firm* — WPAT, PC (57) ABSTRACT

A solid state storage device includes a control circuit and a non-volatile memory. The control circuit includes a retry table. In addition, plural retry read-voltage sets are recorded in the retry table, and the retry table is divided into plural retry sub-tables. The plural retry read-voltage sets are classified into plural groups. The plural retry read-voltage sets are recorded into the corresponding retry sub-tables. The non-volatile memory is connected with the control circuit. During a read retry process of a read cycle, the control circuit performs a hard decoding process according to a retry sub-table of the plural retry sub-tables. If the hard decoding process fails, the control circuit performs a soft decoding process according to another retry sub-table of the plural retry sub-tables.

9 Claims, 6 Drawing Sheets

SOLID STATE STORAGE DEVICE AND READ RETRY METHOD THEREOF

This application claims the benefit of People's Republic of China Patent Application No. 201810878000.X, filed Aug. 3, 2018, the subject matter of which is incorporated herein by reference.

FIELD OF THE INVENTION

The present invention relates to a solid state storage device and a control method, and more particularly to a solid state storage device and a read retry method thereof.

BACKGROUND OF THE INVENTION

As is well known, solid state storage devices such as SD cards or solid state drives (SSD) are widely used in various electronic devices.

Generally, a solid state storage device comprises a non-volatile memory. After data are written to the non-volatile memory, if no electric power is supplied to the solid state storage device, the data are still retained in the non-volatile memory.

Figure 1:
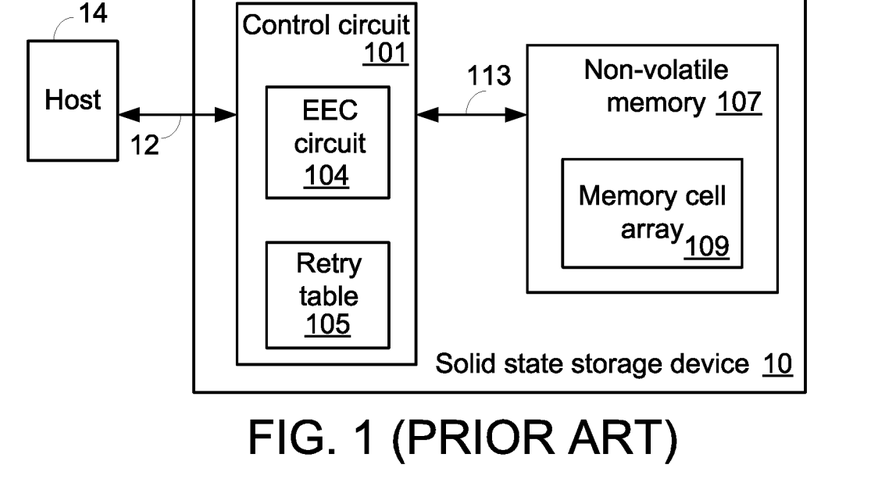
FIG. 1 (prior art) is a schematic functional block diagram illustrating the architecture of a conventional solid state storage device.

FIG. 1 is a schematic functional block diagram illustrating the architecture of a conventional solid state storage device. As shown in FIG. 1, the solid state storage device 10 comprises a control circuit 101 and a non-volatile memory 107.

The control circuit 101 further comprises an error correction (ECC) circuit 104 and a retry table 105. The retry table 105 is stored or temporarily stored in a memory of the control circuit 101. In addition, the retry table 105 stores plural read-voltage sets.

The non-volatile memory 107 further comprises a memory cell array 109. The memory cell array 109 comprises plural memory cells. Generally, the memory cell array 109 is divided into plural blocks, and each block is divided into plural pages.

The solid state storage device 10 is connected with a host 14 through an external bus 12. For example, the external bus 12 is an USB bus, a SATA bus, a PCIe bus, a M.2 bus, an U.2 bus, or the like.

Moreover, the control circuit 101 is connected with the non-volatile memory 107 through an internal bus 113. According to a write command from the host 14, the control circuit 101 stores the write data from the host 14 to the memory cell array 109. Alternatively, according to a read command from the host 14, the control circuit 101 acquires a read data from the memory cell array 109. In addition, the read data is transmitted to the host 14 through the control circuit 101.

Generally, the retry table 105 of the control circuit 101 stores a default read-voltage set. When the control circuit 101 receives a read command, the control circuit 101 actives a read cycle. During the read cycle, the control circuit 101 transmits an operation command to the non-volatile memory 107 through the internal bus 113. The control circuit 101 judges the previously-stored read data in the memory cell array 109 of the non-volatile memory 107 according to the default read-voltage set.

The ECC circuit 104 of the control circuit 101 is used for correcting the error bits of the read data. After the error bits of the read data are corrected, accurate read data are transmitted to the host 14.

However, if the ECC circuit 104 is unable to successfully correct all error bits of the read data, the read data cannot be outputted to the host 14. Under this circumstance, the retry table 105 of the control circuit 101 provides other retry read-voltage sets sequentially. According to the retry read-voltage sets, the control circuit 101 performs a read retry operation on the non-volatile memory 107.

Depending on the data amount to be stored in the memory cell, the memory cells may be classified into four types, i.e. a single-level cell (SLC), a multi-level cell (MLC), a triple-level cell (TLC) and a quad-level cell (QLC). The SLC can store only one bit of data per cell. The MLC can store two bits of data per cell. The TLC can store three bits of data per cell. The QLC can store four bits of data per cell. In other words, the memory cell array 109 is a SLC memory cell array, a MLC memory cell array, a TLC memory cell array or a QLC memory cell array.

In the memory cell array 109, each memory cell comprises a floating gate transistor. By adjusting the number of hot carriers injected into a floating gate of the floating gate transistor, the storing state of the floating gate transistor is adjusted. In other words, the floating gate transistor of each SLC has two storing states, the floating gate transistor of each MLC has four storing states, the floating gate transistor of each TLC has eight storing states, and the floating gate transistor of each QLC has sixteen storing states.

Figure 2A:
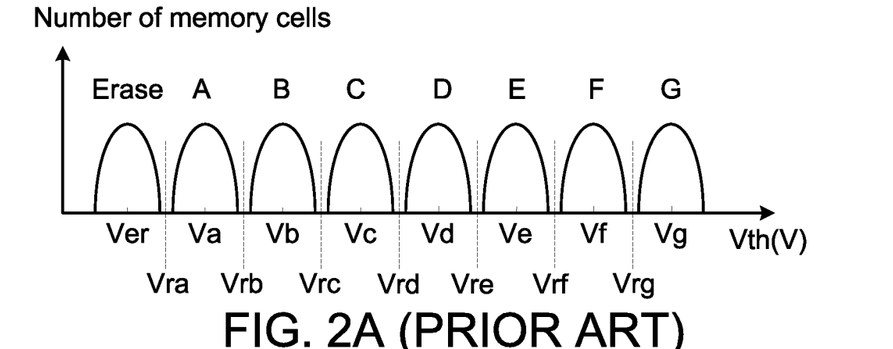
FIG. 2A (prior art) schematically illustrates the threshold voltage distribution curves of triple-level cells in different storing states.

FIG. 2A schematically illustrates the threshold voltage distribution curves of triple-level cells in different storing states. According to the number of injected hot carriers, the triple-level cell has eight storing states "Erase" and "A"~"G". Before the hot carriers are injected into the floating gate of the memory cell, the memory cell is in a storing state "Erase". As the number of the injected hot carriers increases, the memory cell is sequentially programmed into the other seven storing states "A"~"G". For example, the memory cell in the storing state "G" has the highest threshold voltage, and the memory cell in the storing state "Erase" has the lowest threshold voltage. After an erase cycle, the memory cell is restored to the storing state "Erase", and there are no or very few hot carriers retained in floating gate of the memory cell.

In practice, even if many memory cells are programmed into the same storing state during the program cycle, the threshold voltages of these memory cells are not all identical. That is, the threshold voltages of these memory cells are distributed in a specified distribution curve with a peak median threshold voltage. The median threshold voltage of the memory cells in the storing state "Erase" is Ver. The median threshold voltage of the memory cells in the storing state "A" is Va. The median threshold voltage of the memory cells in the storing state "B" is Vb. The median threshold voltage of the memory cells in the storing state "C" is Vc. The median threshold voltage of the memory cells in the storing state "D" is Vd. The median threshold voltage of the memory cells in the storing state "E" is Ve. The median threshold voltage of the memory cells in the storing state "F" is Vf. The median threshold voltage of the memory cells in the storing state "G" is Vg.

Please refer to FIG. 2A again. According to the above characteristics of the triple-level cell, a default read-voltage set including seven read voltages Vra~Vrg is defined. During the read cycle, the control circuit 101 provides the default read-voltage set to the non-volatile memory 107 in order to detect the storing states of the triple-level cells of the memory cell array 109.

The storing states of the triple-level cells are determined according to the read voltages Vra~Vrg. For example, the read voltage Vrg is provided from the non-volatile memory 107 to the memory cell array 109. If the threshold voltage of the memory cell is higher than the read voltage Vrg and the memory cell is turned off, the memory cell is judged to be in the storing state "G". Whereas, if the threshold voltage of the memory cell is lower than the read voltage Vrg and the memory cell is turned on, the memory cell is not in the storing state "G". In other words, the eight storing states of the triple-level cells are determined according to the seven read voltages Vra~Vrg of the default read voltage set.

Similarly, the sixteen storing states of the quad-level cells are determined according to fifteen read voltages of the default read-voltage set. Similarly, four storing states of the multi-level cells are determined according to three read voltages of the default read-voltage set. Similarly, two storing states of the single-level cells are determined according to one read voltage of the default read-voltage set.

Figure 2B:
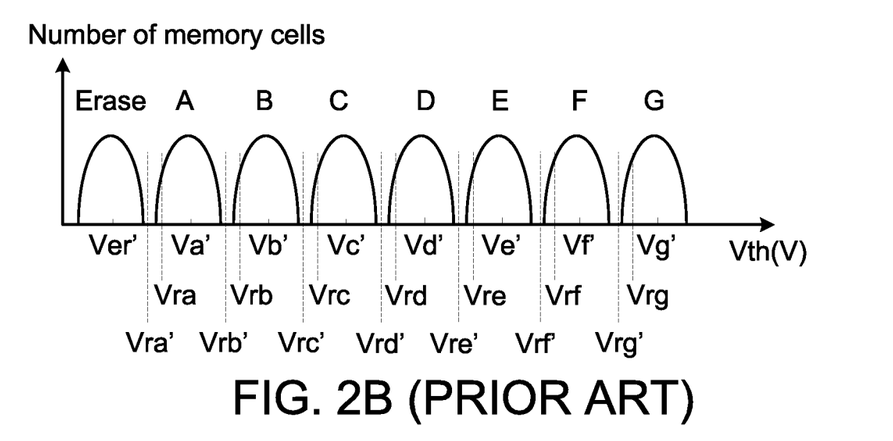
FIG. 2B (prior art) schematically illustrates the shift of the threshold voltage distribution curves of triple-level cells in different storing states.

FIG. 2B schematically illustrates the shift of the threshold voltage distribution curves of triple-level cells in different storing states. In practice, the solid state storage device 10 is possibly in a failure mode. For example, the failure mode includes an erase/programmed cycling mode, a high/room temperature baking mode, a read disturbing mode, a cross-temperature read/write mode, and the like. In the failure mode, the threshold voltage distribution curves of the memory cells of the memory cell array 109 are shifted. Moreover, if the data retention period of the triple-level cells is very long (e.g., over one month), the threshold voltage distribution curves are possibly shifted. Moreover, when the solid state storage device 10 is in the failure mode, the read data cannot be accurately read back by using the default read-voltage set.

In U.S. Pat. No. 9,922,706, a solid state storage device using a state prediction method is disclosed. The state prediction method predicts the shift of any of the read voltages Vra~Vrg and predicts the failure mode of the solid state storage device 10.

As shown in FIG. 2B, the threshold voltage distribution curves of the triple-level cells are shifted. The median threshold voltage of the memory cells in the storing state "Erase" is Ver'. The median threshold voltage of the memory cells in the storing state "A" is Va'. The median threshold voltage of the memory cells in the storing state "B" is Vb'. The median threshold voltage of the memory cells in the storing state "C" is Vc'. The median threshold voltage of the memory cells in the storing state "D" is Vd'. The median threshold voltage of the memory cells in the storing state "E" is Ve'. The median threshold voltage of the memory cells in the storing state "F" is Vf'. The median threshold voltage of the memory cells in the storing state "G" is Vg'.

If the storing states of the triple-level cells are determined according to the read voltages Vra~Vrg of the default read-voltage set, the number of error bits in the read data increases. If the ECC unit 104 is unable to successfully correct all error bits of the read data, the retry table 105 of the control circuit 101 provides another retry read-voltage set including the read voltages Vra'~Vrg'. According to the retry read-voltage set, the control circuit 101 performs the read retry process.

Figure 3:
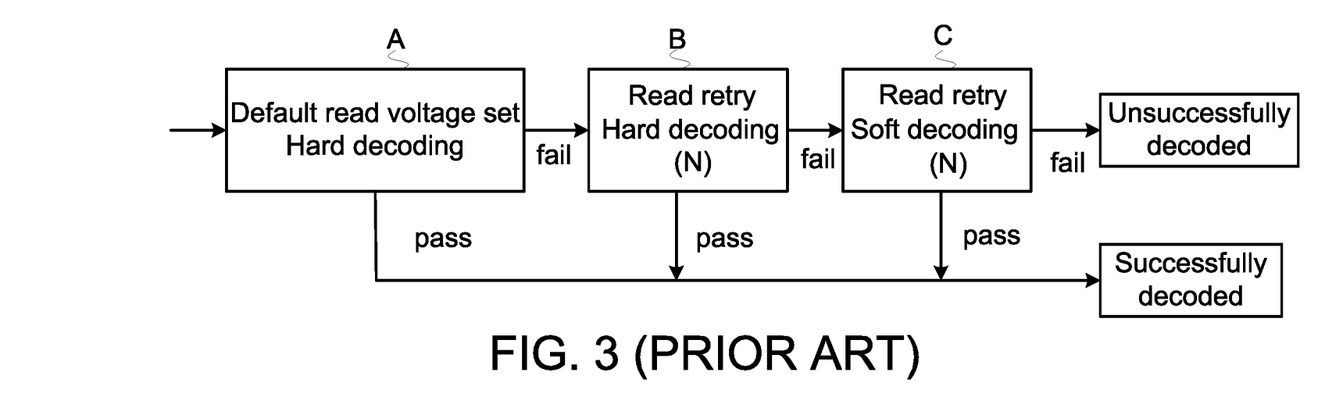
FIG. 3 (prior art) schematically illustrates a flowchart of a read retry method for the conventional solid state storage device.

FIG. 3 schematically illustrates a flowchart of a read retry method for the conventional solid state storage device. During the read cycle, the control circuit 101 performs a decoding process A. In the decoding process A, a hard decoding operation is performed according to the default read-voltage set. That is, the control circuit 101 provides the default read-voltage set to the non-volatile memory 107, and the ECC circuit 104 performs the hard decoding operation to correct the read data.

If the error bits in the read data can be corrected, it means that the decoding process A passes and the decoding operation is successfully done. Consequently, the read data can be accurately transmitted from the control circuit 101 to the host 14. Whereas, if the error bits in the read data cannot be corrected, the read data is not accurately acquired and the decoding process A fails. Then, the control circuit 101 performs a read retry process.

After the control circuit 101 enters the read retry process, a decoding process B is firstly performed. In the decoding process B, a hard decoding operation is performed according to a retry read-voltage set. For example, the retry table 105 of the control circuit 101 provides the selected retry read-voltage set Vra'~Vrg' to the non-volatile memory 107 to acquire the read data. Then, the ECC circuit 104 performs the hard decoding operation to correct the read data. If the error bits in the read data can be corrected, it means that the decoding operation is successfully done in the decoding process B. Consequently, the read data can be accurately transmitted from the control circuit 101 to the host 14. Whereas, if the error bits in the read data cannot be corrected, the read data is not accurately acquired and the decoding process B fails. Then, the retry table 105 of the control circuit 101 continuously provides another selected retry read-voltage set to the non-volatile memory 107 and performs the decoding process B.

Generally, plural retry read-voltage sets (e.g., N retry read-voltage sets) have been stored in the retry table 105 of the control circuit 101. If the decoding operation is successfully done according to one of the plural retry read-voltage sets, it means that the decoding process B passes. Whereas, if the data cannot be successfully decoded according to the entire of the N retry read-voltage sets or if the data cannot be successfully decoded according to a portion of the retry read-voltage sets, which are selected from N retry read-voltage sets through an algorithm, it means that the decoding process B fails. Then, the control circuit 101 performs a decoding process C. Obviously, the time period of performing the decoding process B is longer than the time period of performing the decoding process A.

In the decoding process C, a soft decoding operation is performed according to the retry read-voltage sets. Generally, the soft decoding operation has better error correction capability than the hard decoding operation. However, the time required to perform the soft decoding operation is much longer. That is, the decoding process C will takes much longer time then process B.

Similarly, if the decoding operation is successfully done by the control circuit 101 according to one of the plural retry read-voltage sets, it means that the decoding process C passes. Consequently, the read data—can be accurately transmitted from the control circuit 101 to the host 14. Whereas, if the data cannot be successfully decoded according to the entire of the N retry read-voltage sets or if the data cannot be successfully decoded according to a portion of the retry read-voltage sets which are selected from N retry read-voltage sets through an algorithm, it means that the decoding process C fails. Under this circumstance, the control circuit 101 confirms that the read data cannot be accurately acquired, and the control circuit 101 generates a failed message to the host 14 to indicate that the decoding process fails.

As mentioned above, if the decoding process A fails, the control circuit 101 enters the read retry process. In the read retry process, the control circuit 101 has to perform the decoding process B at first. If the control circuit 101 confirms that the decoding process B fails, the control circuit 101 performs the decoding process C. If the control circuit 101 confirms that the decoding process C fails, the control circuit 101 issues the failed message to the host 14 and is unable to provide the accurate read data.

In practice, the solid state storage device 10 is possibly fallen into some known failure modes. For example, these failure modes include: erase/programming cycling mode, high/room temperature baking mode, read disturbing mode, cross-temperature read/write mode, and the like. In these failure modes, the threshold voltage distribution curves of the memory cells of the memory cell array 109 are shifted and read data cannot be accurately acquired by using the default read-voltage set.

Generally, after the non-volatile memory 107 is produced, the non-volatile memory 107 will undergo many experiments about various failure modes. Consequently, plural retry read-voltage sets are acquired and provided to the manufacturer of the solid state storage device 10. Moreover, the plural retry read-voltage sets may be optimized by the manufacturer of the solid state storage device 10, or some retry read-voltage sets may be added to the retry table 105 according to the developing experience of the manufacturer. After the solid state storage device 10 leaves the factory, these retry read-voltage sets are recorded or temporarily stored in the retry table 105 of the control circuit 101.

In the normal working state, the solid state storage device 10 performs the decoding process B and the decoding process C of FIG. 3 according to the retry read-voltage sets in the retry table 105.

Figure 4:
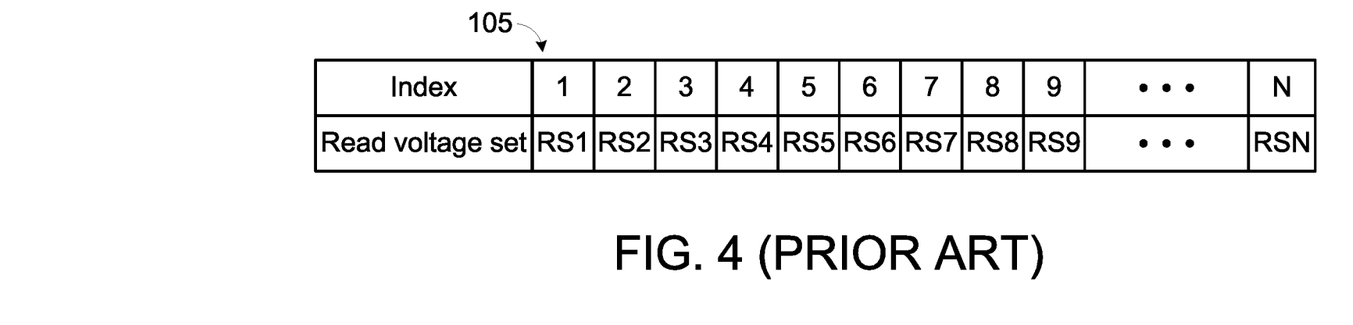
FIG. 4 (prior art) schematically illustrates a conventional retry table.

FIG. 4 schematically illustrates a conventional retry table. The retry table 105 contains an index field and N retry read-voltage sets RS1~RSN. The control circuit 101 provides the N retry read-voltage sets to the non-volatile memory 107 according to the index field of the retry table 105. During the read retry process, the retry read-voltage sets RS1~RSN corresponding to the index "1"~index "N" are sequentially provided to the non-volatile memory 107.

While the decoding process B and the decoding process C of FIG. 3 are performed, the retry table 105 of the control circuit 101 provides the N retry read-voltage sets RS1~RSN to the non-volatile memory 107 sequentially.

For preventing from the read failure condition, the manufacturer of the non-volatile memory 107 and the manufacturer of the solid state storage device 10 provide many retry read-voltage sets such as 300 retry read-voltage sets (i.e., N=300). During the read retry process, the control circuit 101 may provide 300 retry read-voltage sets to the non-volatile memory 107 to perform the decoding process B.

If the decoding process B fails, the control circuit 101 may further provide these 300 retry read-voltage sets to the non-volatile memory 107 again to perform the decoding process C.

As mentioned above, after the control circuit 101 enters the read retry process, the control circuit 101 provides N retry read-voltage sets to the non-volatile memory 107 to perform the decoding process B and the decoding process C. Since it takes much longer time to perform the read retry process, the read speed of the solid state storage device 10 is largely reduced.

SUMMARY OF THE INVENTION

An embodiment of the present invention provides a solid state storage device. The solid state storage device includes a control circuit and a non-volatile memory. The control circuit includes a retry table. In addition, plural retry read-voltage sets are recorded in the retry table, and the retry table is divided into plural retry sub-tables. The plural retry read-voltage sets are classified into plural groups. The plural retry read-voltage sets are recorded into the corresponding retry sub-tables. The non-volatile memory is connected with the control circuit. During a read retry process of a read cycle, the control circuit performs a hard decoding process according to a retry sub-table of the plural retry sub-tables. If the hard decoding process fails, the control circuit performs a soft decoding process according to another retry sub-table of the plural retry sub-tables.

Another embodiment of the present invention provides a read retry method for a memory cell array of the solid state storage device. After the read retry process is entered, the hard decoding process is performed according to a first retry sub-table of the plural retry sub-tables. If the hard decoding process fails, performing the soft decoding process according to a second retry sub-table of the plural retry sub-tables.

Another embodiment of the present invention provides a read retry method for a memory cell array of the solid state storage device. After the read retry process is entered, a failure mode is predicted. Then, the hard decoding process is performed according to a first retry sub-table of the plural retry sub-tables corresponding to the failure mode. If the hard decoding process fails, the soft decoding process is performed according to a second retry sub-table of the plural retry sub-tables corresponding to the same failure mode.

Another embodiment of the present invention provides a read retry method for a memory cell array of the solid state storage device. After the read retry process is entered, the hard decoding process is performed according to a first retry sub-table of the plural retry sub-tables. If a read data is generated according to the first retry sub-table, a failure mode is predicted. If the read data is not generated according to the first retry sub-table, the hard decoding process is performed according to a second retry sub-table of the plural retry sub-tables. If the hard decoding process fails, the soft decoding process is performed according to a third retry sub-table of the plural retry sub-tables. If the read data is generated according to the third retry sub-table, the failure mode is predicted. If the read data is not generated according to the third retry sub-table, the soft decoding process is performed according to a fourth retry sub-table of the plural retry sub-tables.

Another embodiment of the present invention provides a read retry method for a memory cell array of the solid state storage device. After the read retry process is entered, the hard decoding process is performed according to a first retry sub-table of the plural retry sub-tables. If a read data is generated according to the first retry sub-table, a failure mode is predicted. If the read data is not generated according to the first retry sub-table, the hard decoding process is performed according to a second retry sub-table of the plural retry sub-tables. If the hard decoding process fails, the failure mode is predicted, the soft decoding process is performed according to a third retry sub-table of the plural retry sub-tables corresponding to the failure mode.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

As mentioned above, the manufacturer of the non-volatile memory only provides some retry read-voltage sets to the manufacturer of the solid state storage device. Moreover, the plural retry read-voltage sets may be optimized by the manufacturer of the solid state storage device, or some retry read-voltage sets may be added to the retry table according to the developing experience of the manufacturer. After the solid state storage device leaves the factory, plural retry read-voltage sets (e.g., N=300) are recorded or temporarily stored in the retry table. Since the number of the retry read-voltage sets is very large, the read speed of the solid state storage device during the read retry process is largely reduced. For solving these drawbacks, the present invention provides a solid state storage device and a read retry method.

In accordance with the present invention, plural retry read-voltage sets are classified into plural groups according to various conditions. The retry read-voltage sets of each group are stored into a corresponding retry sub-table. When the solid state storage device enters the read retry process, the retry sub-table with less number of retry read-voltage sets is acquired according to the condition. Consequently, the time period of performing the read retry process of the solid state storage device is reduced, and the read speed of the solid state storage device is increased.

Figure 5:
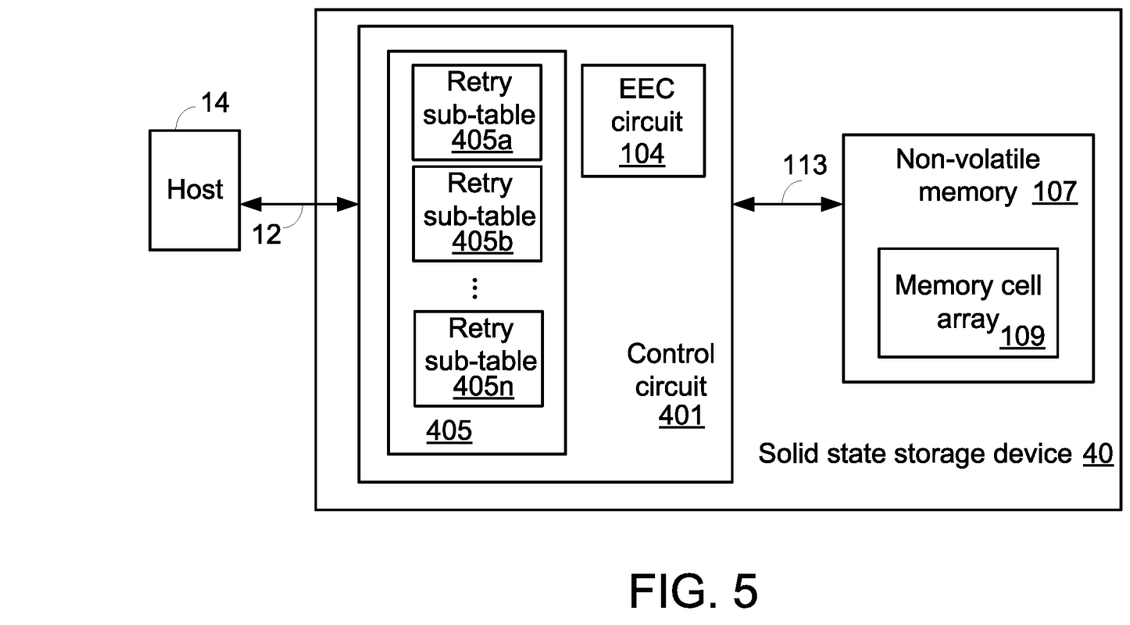
FIG. 5 is a schematic functional block diagram illustrating the architecture of a solid state storage device according to an embodiment of the present invention.

FIG. 5 is a schematic functional block diagram illustrating the architecture of a solid state storage device according to an embodiment of the present invention. As shown in FIG. 5, the solid state storage device 40 comprises a control circuit 401 and a non-volatile memory 107.

The control circuit 401 further comprises an error correction (ECC) circuit 104 and a retry table 405. The retry table 405 is stored in a memory of the control circuit 401. The retry table 405 is divided into plural retry sub-tables 405a-405n. In addition, each of the retry sub-tables 405a-405n stores plural retry read-voltage sets.

Figure 6A:
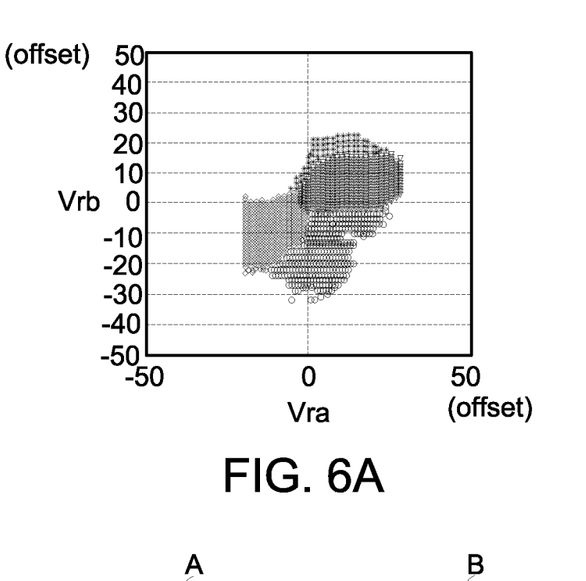
FIGS. 6A and 6B are plots illustrating the analysis on the read voltage sets.
Figure 6B:
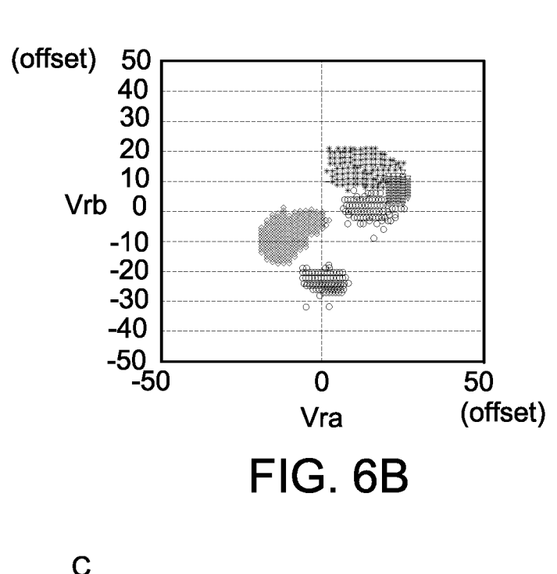

FIGS. 6A and 6B are plots illustrating the analysis on the read voltage sets. After all retry read-voltage sets are analyzed by the manufacturer of the solid state storage device, the suitable decoding processes for the retry read-voltage sets are determined. In addition, N retry read-voltage sets are classified into two groups.

After all retry read-voltage sets are analyzed, the analysis diagrams as shown in FIGS. 6A and 6B are produced. In FIGS. 6A and 6B, only the offsets for two read voltages Vra and Vrb of each retry read-voltage set are shown. In case that the offsets for the read voltages Vra and Vrb are zero, the read voltages Vra and Vrb are default read voltages. In case that the offsets for the read voltages Vra and Vrb are not zero, the read voltages Vra and Vrb are retry read voltages.

In a first embodiment, the N retry read-voltage sets are classified into two groups. The retry read-voltage sets of the first group as shown in FIG. 6A are suitable for the hard decoding process. The retry read-voltage sets of the second group as shown in FIG. 6B are suitable for the soft decoding process.

Generally, if the threshold voltage distribution curves of the memory cells of the memory cell array 109 are not obviously shifted, the hard decoding process B is good enough to correct all the error bits. That is, the hard decoding process B passes according to the retry read-voltage sets with smaller offsets (see FIG. 6A).

Whereas, if the threshold voltage distribution curves of the memory cells of the memory cell array 109 are obviously shifted, the hard decoding process B fails. Under this circumstance, the soft decoding process C is sufficient to successfully decode the read data. That is, the soft decoding process C passes according to the retry read-voltage sets with larger offsets (see FIG. 6B).

As mentioned above, the N retry read-voltage sets are classified into two groups. The first group contains K retry read-voltage sets, and the second group contains M retry read-voltage sets, wherein N=K+M. The K retry read-voltage sets are suitable for the hard decoding process. The M retry read-voltage sets are suitable for the soft decoding process. The K retry read-voltage sets are stored in the retry sub-table 405a of the retry table 405. The M retry read-voltage sets are stored in the retry sub-table 405b of the retry table 405.

Figure 6C:
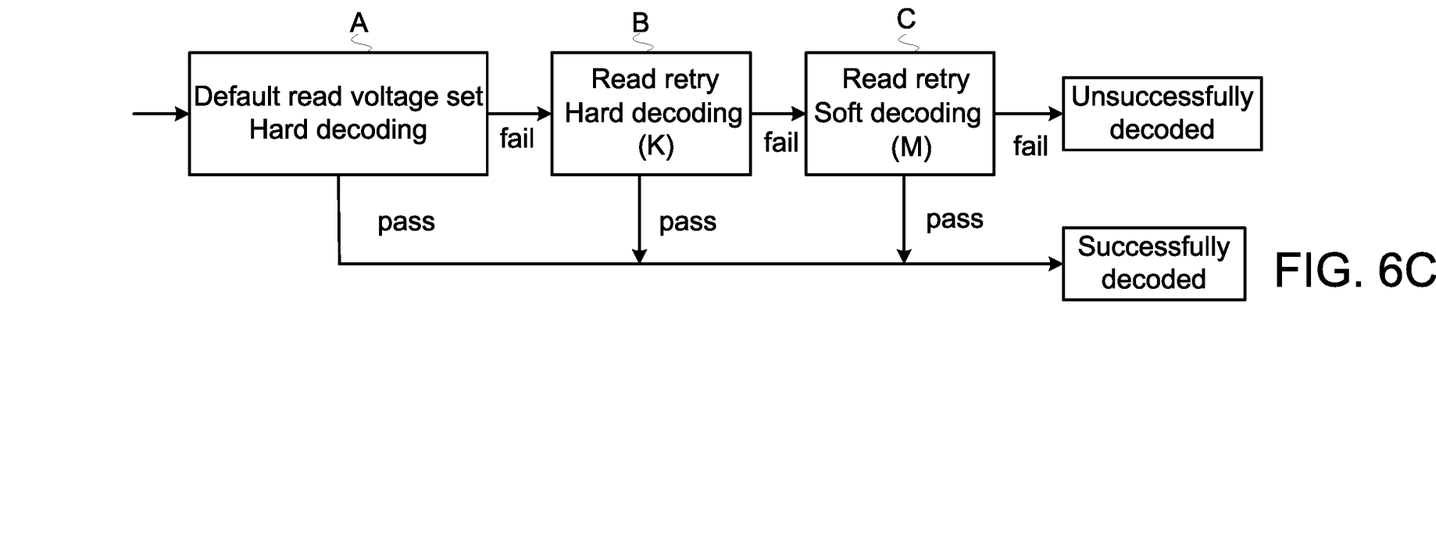
FIG. 6C schematically illustrates a flowchart of a read retry method according to a first embodiment of the present invention.

FIG. 6C schematically illustrates a flowchart of a read retry method according to a first embodiment of the present invention. In comparison with the read retry method of FIG. 3, the read retry method provides less number of retry read-voltage sets (i.e., K<N) in the hard decoding process B and provides less number of retry read-voltage sets (i.e., M<N) in the soft decoding process C.

During the decoding process B, the control circuit 401 selects a retry read-voltage set from the retry sub-table 405a of the retry table 405 and provides the selected retry read-voltage set to the non-volatile memory 107 to acquire the read data. Then, the ECC circuit 104 performs the hard decoding operation to correct the read data. If all the error bits in the read data can be corrected, it means that the decoding operation is successfully done to pass the decoding process B. Consequently, the read data can be accurately transmitted from the control circuit 101 to the host 14. Whereas, if some of the error bits in the read data cannot be corrected, the read data is not accurately acquired and the decoding process B fails. Then, the control circuit 401 selects another retry read-voltage set from the retry sub-table 405a of the retry table 405 to perform the decoding process B.

As mentioned above, K retry read-voltage sets are stored in the retry sub-table 405a of the retry table 405. If the decoding operation is successfully done according to one of the K retry read-voltage sets, it means that the decoding process B passes. Whereas, if the data cannot be successfully decoded according to the entire of the K retry read-voltage sets, it means that the decoding process B fails. Then, the control circuit 401 performs a decoding process C.

In the decoding process C, the control circuit 401 performs a soft decoding operation according to the M retry read-voltage sets are stored in the retry sub-table 405b of the retry table 405. The detailed action of the decoding process C is not redundantly described herein.

In the read retry method of the above embodiment, the N retry read-voltage sets in the retry table are classified into the first group and the second group. The first group contains the K retry read-voltage sets for the hard decoding process. The second group contains the M retry read-voltage sets for the soft decoding process. Since the number of retry read-voltage sets in the retry sub-table 405a and the number of retry read-voltage sets in the retry sub-table 405b are reduced, the read speed of the solid state storage device 40 is effectively increased.

Figure 7A:
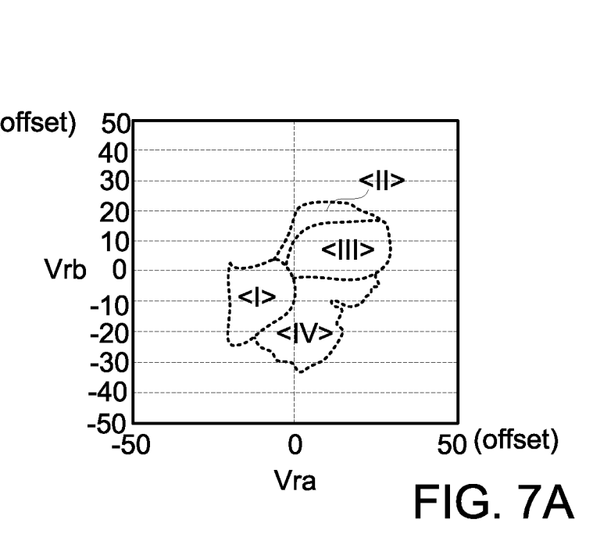
FIGS. 7A and 7B are plots illustrating the analysis on the read voltage sets in different failure modes.
Figure 7B:
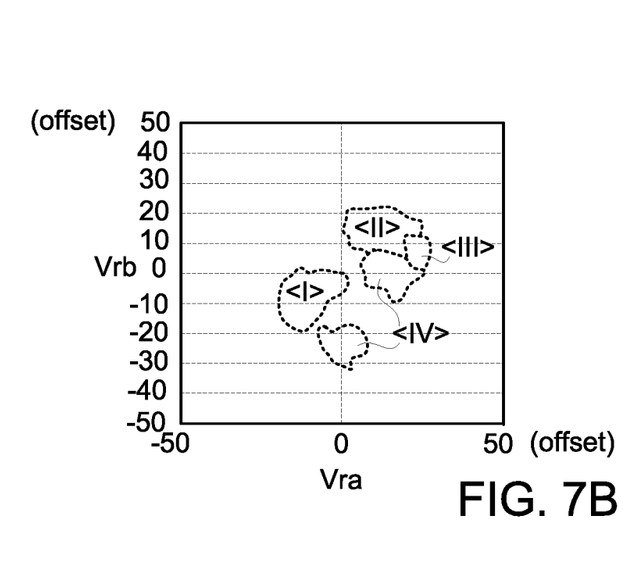

FIGS. 7A and 7B are plots illustrating the analysis on the read-voltage sets in different failure modes. Similarly, N retry read-voltage sets are classified into two groups. In addition, the two groups are divided into plural sub-groups according to different failure modes.

Please refer to FIGS. 7A and 7B. When the solid state storage device 40 is in a first failure mode, e.g., a low temperature write and high temperature read (LTW-HTR) mode, the retry read-voltage sets in the zone <I> are suitable for the read retry process to handle this kind of failure mode. When the solid state storage device 40 is in a second failure mode, e.g., a high temperature write and low temperature read (HTW-LTR) mode, the retry read-voltage sets in the zone <II> are suitable for the read retry process to handle such case. When the solid state storage device 40 is in a third failure mode, e.g., a read disturb mode, the retry read-voltage sets in the zone <III> are more suitable for the read retry process to handle it. When the solid state storage device 40 is in a fourth failure mode, e.g., a high temperature data retention (HTDR) mode, the retry read-voltage sets in the zone <IV> are suitable for the read retry process.

According to the four failure modes, the two groups are divided into plural sub-groups. The K retry read-voltage sets of the first group are classified into four sub-groups. The four sub-groups contain $K_{F1}$ retry read-voltage sets, $K_{F2}$ retry read-voltage sets, $K_{F3}$ retry read-voltage sets and $K_{F4}$ retry read-voltage sets, respectively. That is, $K=K_{F1}+K_{F2}+K_{F3}+K_{F4}$. The retry read-voltage sets of the four sub-groups of the first group are stored in four corresponding retry sub-tables of the retry table 405.

Similarly, the M retry read-voltage sets of the second group are classified into four sub-groups. The four sub-groups contain $M_{F1}$ retry read-voltage sets, $M_{F2}$ retry read-voltage sets, $M_{F3}$ retry read-voltage sets and $M_{F4}$ retry read-voltage sets, respectively. That is, $M=M_{F1}+M_{F2}+M_{F3}+M_{F4}$. The retry read-voltage sets of the four sub-groups of the second group are stored in four corresponding retry sub-tables of the retry table 405. In other words, the retry table 405 contains eight retry sub-tables.

In the second embodiment, four failure modes of the solid state storage device are presented herein for purpose of illustration and description only. It is noted that the number of the failure modes is not restricted as long as the read retry method of the present invention is successfully implemented.

Figure 7C:
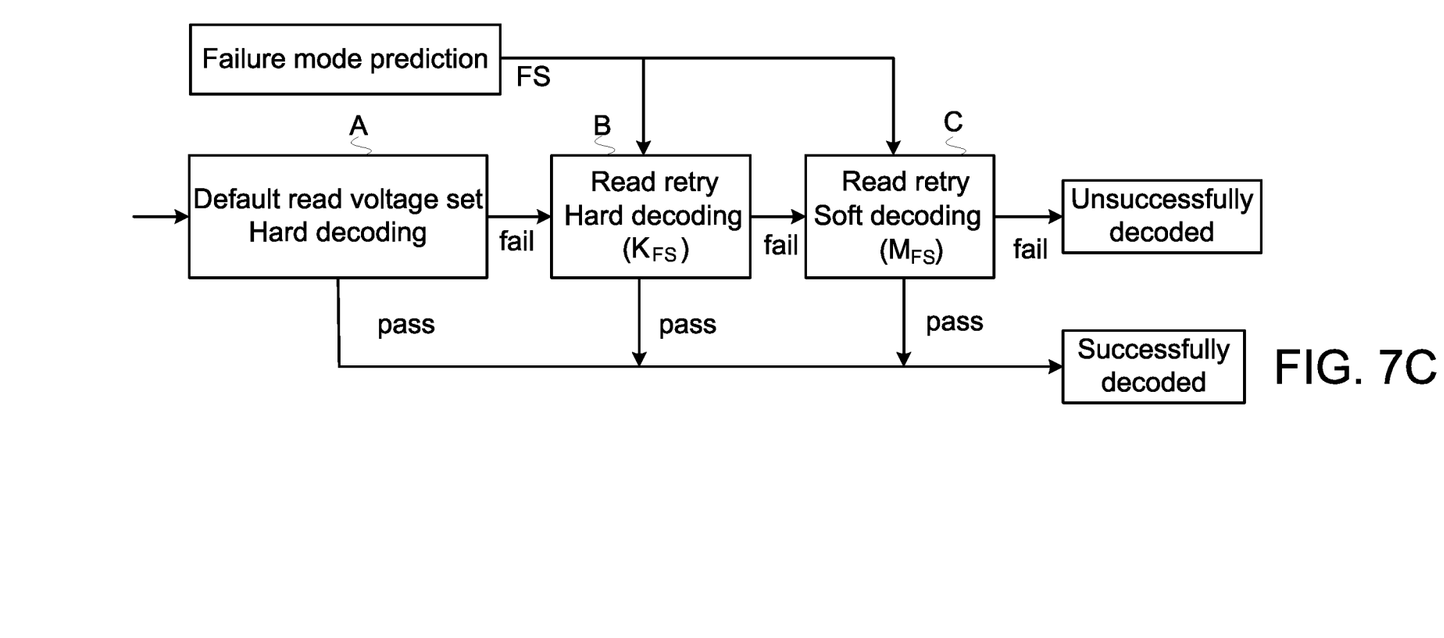
FIG. 7C schematically illustrates a flowchart of a read retry method according to a second embodiment of the present invention.

FIG. 7C schematically illustrates a flowchart of a read retry method according to a second embodiment of the present invention. During the decoding process, the control circuit 401 predicts the current failure mode FS. The control circuit 401 performs the hard decoding process according to the retry read-voltage sets $K_{FS}$ of the corresponding retry sub-table in the failure mode FS. If the decoding process B fails, the control circuit 401 performs the decoding process C. Similarly, the control circuit 401 performs the soft decoding process according to the retry read-voltage sets $M_{FS}$ of the corresponding retry sub-table in the failure mode FS.

For example, if the control circuit 401 predicts that the failure mode FS is the first failure mode (FS=F1), the control circuit 401 performs the hard decoding process according to the retry read-voltage sets $K_{F1}$ of the corresponding retry sub-table. If the decoding process B fails, the control circuit 401 performs the decoding process C. Similarly, the control circuit 401 performs the soft decoding process according to the retry read-voltage sets $M_{F1}$ of the corresponding retry sub-table in the first failure mode (FS=F1).

In the read retry method of this embodiment, the control circuit 401 selects the corresponding retry sub-table to perform the decoding process B or the decoding process C according to the failure mode. In comparison with the first embodiment, the number of the retry read-voltage sets in the retry sub-table is further reduced. Consequently, the read speed of the solid state storage device 40 is effectively increased.

Figure 8:
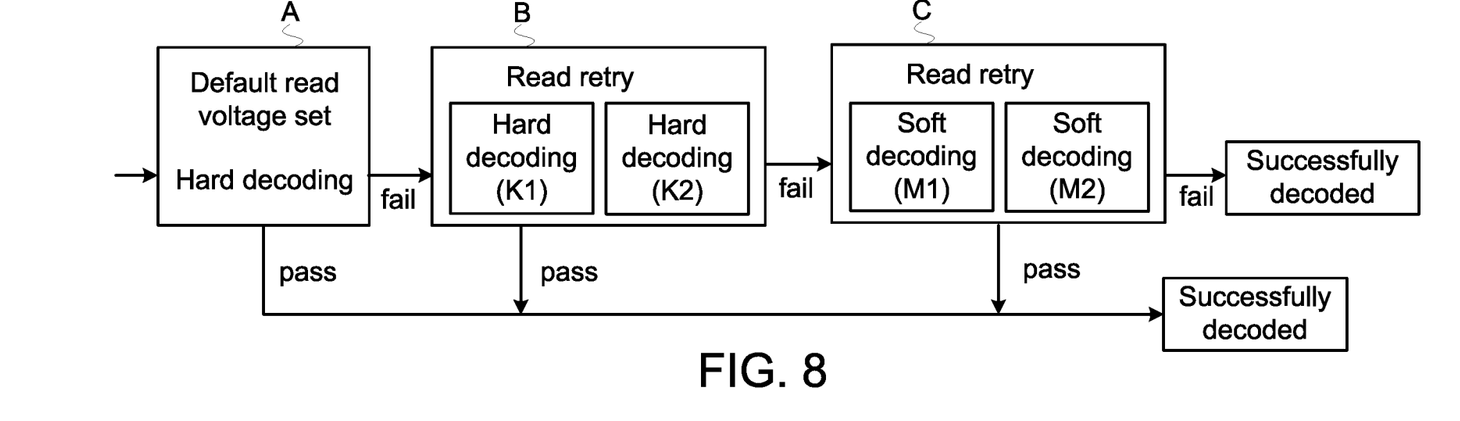
FIG. 8 schematically illustrates a flowchart of a read retry method according to a third embodiment of the present invention.

It is noted that the above two embodiments may be properly modified. FIG. 8 schematically illustrates a flowchart of a read retry method according to a third embodiment of the present invention. Similarly, the N retry read-voltage sets are classified into two groups. The first group contains K retry read-voltage sets, and the second group contains M retry read-voltage sets, wherein N=K+M. In this embodiment, each group is divided into two sub-groups. The two sub-groups of the first group contain K1 retry read-voltage sets and K2 retry read-voltage sets, respectively. The K1 retry read-voltage sets are stored in a first retry sub-table of the retry table 405. The K2 retry read-voltage sets are stored in a second retry sub-table of the retry table 405. The two sub-groups of the second group contain M1 retry read-voltage sets and M2 retry read-voltage sets, respectively. The M1 retry read-voltage sets are stored in a third retry sub-table of the retry table 405. The M2 retry read-voltage sets are stored in a fourth retry sub-table of the retry table 405.

Please also refer to FIG. 7A. In this embodiment, at least one critical retry read-voltage set corresponding to the zone <I>, at least one critical retry read-voltage set corresponding to the zone <II>, at least one critical retry read-voltage set corresponding to the zone <III> and at least one critical retry read-voltage set corresponding to the zone <IV> are collaboratively defined as the K1 retry read-voltage sets. The other retry read-voltage sets are collaboratively defined as the K2 retry read-voltage sets. Please also refer to FIG. 7B. In this embodiment, at least one critical retry read-voltage set corresponding to the zone <I>, at least one critical retry read-voltage set corresponding to the zone <II>, at least one critical retry read-voltage set corresponding to the zone <III> and at least one critical retry read-voltage set corresponding to the zone <IV> are collaboratively defined as the M1 retry read-voltage sets. The other retry read-voltage sets are collaboratively defined as the M2 retry read-voltage sets. The critical retry read-voltage set is the retry read-voltage set with the higher successful decoding probability.

During the decoding process B, the control circuit 401 selects a retry read-voltage set from the first retry sub-table of the retry table 405. If the data cannot be successfully decoded according to the entire of the K1 retry read-voltage sets of the first retry sub-table, the control circuit 401 selects a retry read-voltage set from the second retry sub-table of the retry table 405.

If the data cannot be successfully decoded according to the entire of the K2 retry read-voltage sets of the second retry sub-table, it means that the decoding process B fails. Then, the control circuit 401 performs a decoding process C.

During the decoding process C, the control circuit 401 selects a retry read-voltage set from the third retry sub-table of the retry table 405. If the data cannot be successfully decoded according to the entire of the M1 retry read-voltage sets of the third retry sub-table, the control circuit 401 selects a retry read-voltage set from the M2 retry read-voltage sets in the fourth retry sub-table of the retry table 405.

For example, the K1 retry read-voltage sets contain four critical retry read-voltage sets corresponding to the four failure modes. If the decoding operation is successfully done according to the second critical retry read-voltage set of the first retry sub-table, the read data is accurately transmitted from the control circuit 401 to the host 14. Under this circumstance, the control circuit 401 also judges that the non-volatile memory 107 is in the second failure mode. Similarly, if the decoding operation is successfully done according to a specified critical retry read-voltage sets of the third retry sub-table, the failure mode of the non-volatile memory 107 can be predicted.

After the control circuit 401 realizes the failure mode of the non-volatile memory 107, the control circuit 401 performs the read retry process. Meanwhile, the read retry method of the second embodiment is performed. Consequently, the decoding process B and the decoding process C are performed to acquire the accurate read data according to the predicted failure mode.

Before the control circuit 401 realizes the failure mode, the read retry method of the third embodiment can predict the failure mode of the non-volatile memory 107. After the control circuit 401 realizes the failure mode, the read retry method of the second embodiment is performed. Consequently, the read speed of the solid state storage device 40 is effectively increased.

Figure 9:
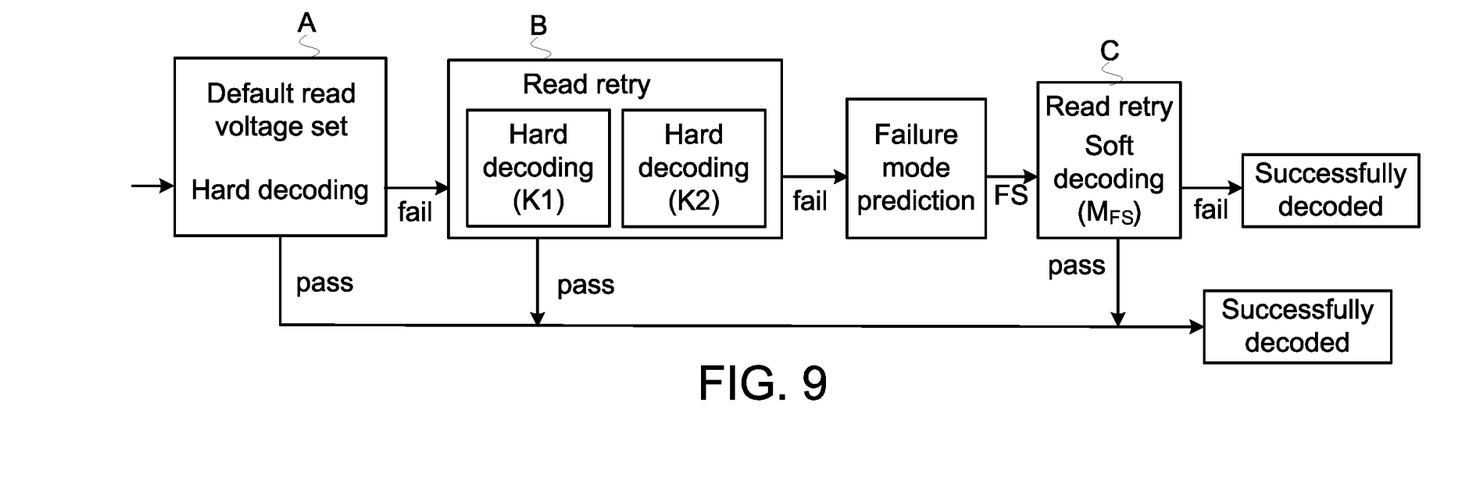
FIG. 9 schematically illustrates a flowchart of a read retry method according to a fourth embodiment of the present invention.

FIG. 9 schematically illustrates a flowchart of a read retry method according to a fourth embodiment of the present invention. The read retry method of this embodiment is the modification of the second embodiment and the third embodiment. The decoding process B of this embodiment is similar to the decoding process B of the third embodiment. The decoding process C of this embodiment is similar to the decoding process C of the second embodiment.

During the decoding process B, the control circuit 401 selects a retry read-voltage set from the first retry sub-table of the retry table 405. If the data cannot be successfully decoded according to the entire of the K1 retry read-voltage sets of the first retry sub-table, the control circuit 401 selects a retry read-voltage set from the second retry sub-table of the retry table 405.

If the data cannot be successfully decoded according to the entire of the K2 retry read-voltage sets of the second retry sub-table, the control circuit 401 predicts the failure mode FS. After the failure mode is predicted, the control circuit 401 performs the decoding process C. Meanwhile, the control circuit 401 performs the soft decoding process according to the retry read-voltage sets $M_{FS}$ of the corresponding retry sub-table in the failure mode FS.

From the above descriptions, the present invention provides a solid state storage device and a read retry method. According to the various conditions of the solid state storage device, plural retry read-voltage sets are classified into plural groups and stored into the corresponding retry sub-tables. When the solid state storage device enters the read retry process, the retry sub-table with less number of retry read-voltage sets is acquired according to the condition. Consequently, the time period of performing the read retry process of the solid state storage device is reduced, and the read speed of the solid state storage device is increased.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A solid state storage device, comprising:
a control circuit comprising a retry table, wherein plural retry read-voltage sets are recorded in the retry table, and the retry table is divided into plural retry sub-tables, wherein the plural retry read-voltage sets are classified into plural groups, and the plural retry read-voltage sets are recorded into the corresponding retry sub-tables; and
a non-volatile memory connected with the control circuit, wherein during a read retry process of a read cycle, the control circuit performs a hard decoding process according to a retry sub-table of the plural retry sub-tables, wherein if the hard decoding process fails, the control circuit performs a soft decoding process according to another retry sub-table of the plural retry sub-tables.

2. The solid state storage device as claimed in claim 1, wherein the plural retry read-voltage sets are classified into a first group and a second group according to the hard decoding process and the soft decoding process, wherein the retry read-voltage sets of the first group and the retry read-voltage sets of the second group are respectively recorded into a first retry sub-table and a second retry sub-table of the plural retry sub-tables, wherein the control circuit performs the hard decoding process according to the first retry sub-table, and the control circuit performs the soft decoding process according to the second retry sub-table.

3. The solid state storage device as claimed in claim 1, wherein the plural retry read-voltage sets are classified into plural groups according to plural failure modes, the hard decoding process and the soft decoding process, and the plural retry read-voltage sets are recorded into the corresponding retry sub-tables.

4. The solid state storage device as claimed in claim 1, wherein the plural retry read-voltage sets are classified into a first group, a second group, a third group and a fourth group according to a successful decoding probability, the hard decoding process and the soft decoding process, wherein the retry read-voltage sets of the first group, the retry read-voltage sets of the second group, the retry read-voltage sets of the third group and the retry read-voltage sets of the fourth group are respectively recorded into a first retry sub-table, a second retry sub-table, a third retry sub-table and a fourth retry sub-table of the plural retry sub-tables, wherein the control circuit performs the hard decoding process according to the first retry sub-table or the second retry sub-table, and the control circuit performs the soft decoding process according to the third retry sub-table or the fourth retry sub-table.

5. A read retry method for a memory cell array of the solid state storage device according to claim 1, the read retry method comprising steps of:
  entering the read retry process;
  performing the hard decoding process according to a first retry sub-table of the plural retry sub-tables; and
  if the hard decoding process fails, performing the soft decoding process according to a second retry sub-table of the plural retry sub-tables.

6. A read retry method for a memory cell array of the solid state storage device according to claim 1, the read retry method comprising steps of:
  entering the read retry process;
  predicting a failure mode;
  performing the hard decoding process according to a first retry sub-table of the plural retry sub-tables corresponding to the failure mode; and
  if the hard decoding process fails, performing the soft decoding process according to a second retry sub-table of the plural retry sub-tables corresponding to the failure mode.

7. A read retry method for a memory cell array of the solid state storage device according to claim 1, the read retry method comprising steps of:
  entering the read retry process;
  performing the hard decoding process according to a first retry sub-table of the plural retry sub-tables;
  if a read data is generated according to the first retry sub-table, predicting a failure mode;
  if the read data is not generated according to the first retry sub-table, performing the hard decoding process according to a second retry sub-table of the plural retry sub-tables;
  if the hard decoding process fails, performing the soft decoding process according to a third retry sub-table of the plural retry sub-tables;
  if the read data is generated according to the third retry sub-table, predicting the failure mode; and
  if the read data is not generated according to the third retry sub-table, performing the soft decoding process according to a fourth retry sub-table of the plural retry sub-tables.

8. The read retry method as claimed in claim 7, wherein the read retry method further comprises steps of:
  entering another read retry process;
  performing the hard decoding process according to a fifth retry sub-table of the plural retry sub-tables corresponding to the failure mode; and
  if the hard decoding process fails, performing the soft decoding process according to a sixth retry sub-table of the plural retry sub-tables corresponding to the failure mode.

9. A read retry method for a memory cell array of the solid state storage device according to claim 1, the read retry method comprising steps of:
  entering the read retry process;
  performing the hard decoding process according to a first retry sub-table of the plural retry sub-tables;
  if a read data is generated according to the first retry sub-table, predicting a failure mode;
  if the read data is not generated according to the first retry sub-table, performing the hard decoding process according to a second retry sub-table of the plural retry sub-tables;
  if the hard decoding process fails, predicting the failure mode; and
  performing the soft decoding process according to a third retry sub-table of the plural retry sub-tables corresponding to the failure mode.

* * * * *